United States Patent [19]
McCarthy et al.

[11] Patent Number: 5,926,522
[45] Date of Patent: Jul. 20, 1999

[54] WAVELENGTH DISPERSIVE X-RAY SPECTROMETER WITH X-RAY COLLIMATOR OPTIC FOR INCREASED SENSITIVITY OVER A WIDE X-RAY ENERGY RANGE

[75] Inventors: Jon J. McCarthy, Middleton; James V. Howard, Madison, both of Wis.

[73] Assignee: Noran Instruments, Inc., Middleton, Wis.

[21] Appl. No.: 09/236,776

[22] Filed: Jan. 25, 1999

Related U.S. Application Data

[60] Provisional application No. 60/072,776, Jan. 27, 1998.
[51] Int. Cl.$^6$ .......................................................... G21K 1/02
[52] U.S. Cl. .............................. 378/84; 378/85; 378/145
[58] Field of Search ................................... 378/43, 44, 49, 378/82, 84, 85, 145, 147, 149

[56] References Cited

U.S. PATENT DOCUMENTS

| | | |
|---|---|---|
| 1,865,441 | 7/1932 | Mutscheller . |
| 2,819,404 | 1/1958 | Hernring et al. . |
| 3,143,651 | 8/1964 | Giacconi et al. . |
| 3,920,999 | 11/1975 | Drexler et al. . |
| 4,242,588 | 12/1980 | Silk et al. . |
| 4,317,036 | 2/1982 | Wang . |
| 4,599,741 | 7/1986 | Wittry . |
| 4,785,470 | 11/1988 | Wood et al. . |
| 4,825,454 | 4/1989 | Annis et al. . |
| 4,897,151 | 1/1990 | Killackey et al. . |
| 4,916,721 | 4/1990 | Carr et al. . |
| 5,016,267 | 5/1991 | Wilkins . |
| 5,033,074 | 7/1991 | Cotter et al. . |
| 5,192,869 | 3/1993 | Kumakhov . |
| 5,263,075 | 11/1993 | McGann et al. . |
| 5,265,143 | 11/1993 | Early et al. . |
| 5,265,144 | 11/1993 | Harding et al. . |
| 5,268,951 | 12/1993 | Flamholz et al. . |
| 5,274,435 | 12/1993 | Hettrick . |
| 5,333,166 | 7/1994 | Seligson et al. . |
| 5,394,451 | 2/1995 | Miyake et al. . |
| 5,408,512 | 4/1995 | Kuwabara et al. . |
| 5,481,109 | 1/1996 | Ninomiya et al. . |
| 5,497,008 | 3/1996 | Kumakhov . |
| 5,570,408 | 10/1996 | Gibson . |
| 5,682,415 | 10/1997 | O'Hara . |
| 5,745,547 | 4/1998 | Xiao ........................................ 378/145 |
| 5,747,821 | 5/1998 | York et al. ............................ 250/505.1 |
| 5,812,631 | 9/1998 | Yan et al. ................................. 378/85 |

FOREIGN PATENT DOCUMENTS

WO 97/14156  4/1997  WIPO .

OTHER PUBLICATIONS

J.P. Kirkland, et al., Wavelength–dispersive x–ray fluorescence detector, Rev. Sci. Instrum. 66 (2), pp. 1410–1412, Feb., 12, 1995.

*Primary Examiner*—David P. Porta
*Attorney, Agent, or Firm*—Foley & Lardner

[57] ABSTRACT

An x-ray collimator for wavelength dispersive spectroscopy and the like includes a grazing incidence mirror optic having a polycapillary x-ray optic nested therein. The polycapillary x-ray optic is mounted in a hollow bore of the grazing incidence mirror optic so as not to interfere with operation of the grazing incidence mirror. The polycapillary x-ray optic extends the range of the grazing incidence mirror optic to higher energy ranges. The x-ray collimator of the present invention may be employed in a wavelength dispersive x-ray spectrometer including a diffracting element positioned to receive x-rays collimated by the x-ray collimator, and an x-ray detector positioned to receive the x-rays defracted by the diffracting element. A wavelength dispersive x-ray spectrometer in accordance with the present invention may be used in combination with an energy beam microscope, such as an electron microscope, to analyze x-rays emanating from a sample specimen.

27 Claims, 7 Drawing Sheets

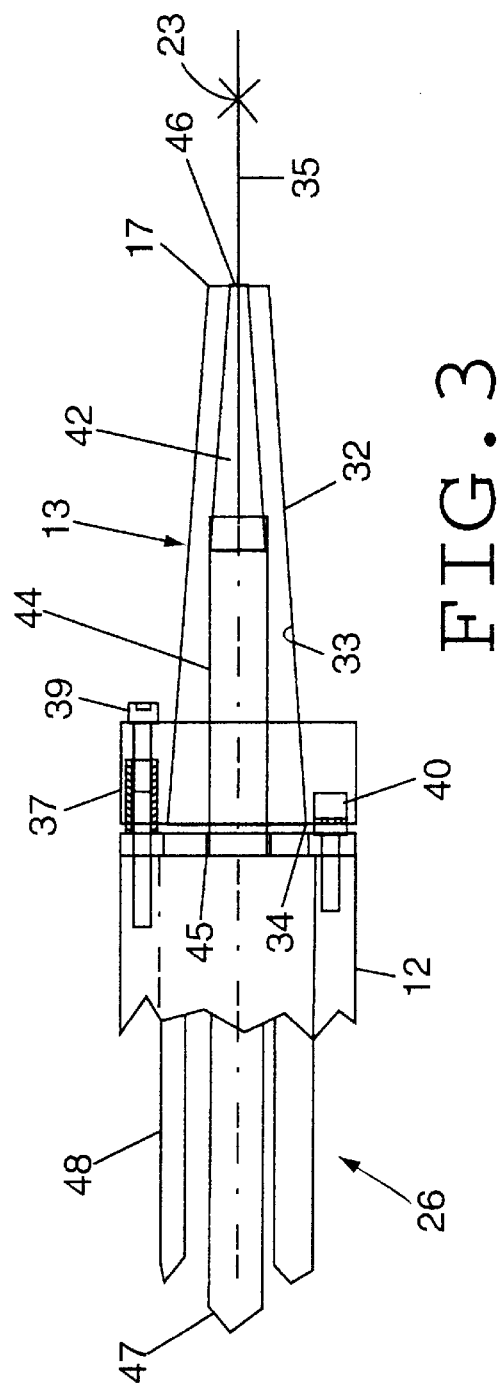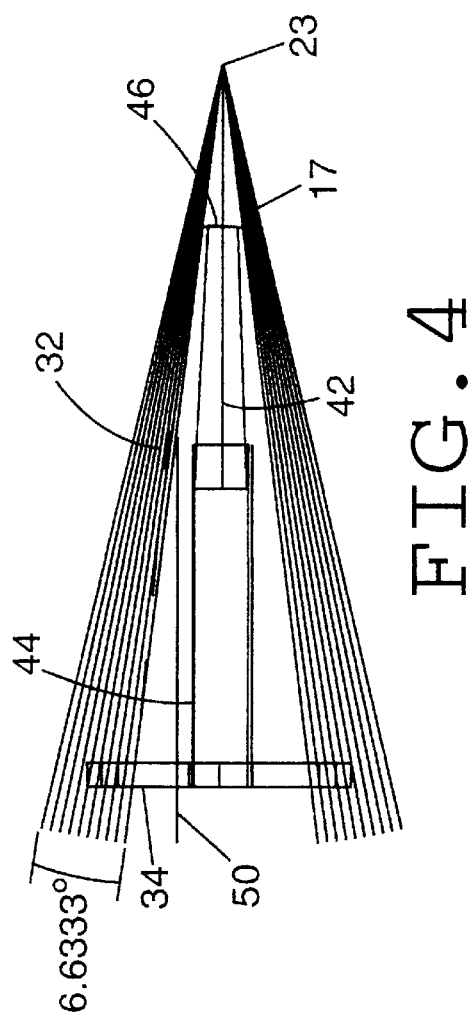

WAVELENGTH DISPERSIVE X-RAY SPECTROMETER WITH X-RAY COLLIMATOR OPTIC FOR INCREASED SENSITIVITY OVER A WIDE X-RAY ENERGY RANGE

This application claims the benefit of U.S. Provisional Application Ser. No. 60/072,776, filed Jan. 27, 1998.

FIELD OF THE INVENTION

This invention pertains generally to the field of x-ray spectroscopy and particularly to x-ray optics for spectroscopy.

BACKGROUND OF THE INVENTION

The electron beam striking a sample in an electron microscope produces x-rays that are characteristic of the material of the sample that is impacted by the electron beam. Consequently, x-ray spectroscopes have been mounted to electron microscopes to analyze the x-rays emanating from the sample. X-rays at wavelengths characteristic of the sample are also produced by fluorescence from interaction of an x-ray beam with the sample, such as in x-ray microscopes. In energy dispersive spectroscopy (EDS), a solid state detector is positioned relatively close to the sample to collect x-rays emanating from the sample. The EDS detector receives and must detect x-rays of many wavelengths, and the resolution of the EDS system is limited by the resolution capability of the available solid state detectors. In wavelength dispersive spectroscopy (WDS), the x-rays emanating from the sample are reflected from a wavelength dispersive element, typically a crystal or multi-layer diffracting element, which reflects the various wavelengths at specific angles. By changing the orientation of the diffracting element or of the position of the detector or both, the wavelength of x-rays that are incident upon the detector after redirection by the diffracting element can be selected, allowing relatively high precision spectroscopy with a capability of resolving relatively narrow peaks. Commonly, the diffracting element has a concave surface so that the x-rays diffracted by the element are either collimated or focussed after reflection onto the detector. The beam spot on the sample, the diffracting element, and detector must all lie on a circle (the Rowland circle) as they are scanned to search new angles—and wavelengths. Thus, a fairly complex and bulky mechanical mounting assembly has been required. The WDS diffractor is thus typically mounted far from the sample in the electron microscope (typically 10 times farther than the detector in an EDS system) and, as a result, collects a relatively small solid angle of the x-rays emanating from the target. Consequently, the photon flux incident on the detector in WDS systems is typically much lower than in EDS systems, and the data collection times in WDS systems are significantly longer than in EDS systems. Generally, a microscope must be run at high beam current to obtain WDS spectra, and in some systems, such as field emission SEM, the beam currents are limited so that conventional WDS cannot be used.

U.S. Pat. No. 5,682,415 to David B. O'Hara describes a conical grazing incidence mirror collimator for x-ray spectroscopy, which can be positioned near a specimen in an electron microscope to receive a relatively large solid angle of x-rays emanating from the sample and to collimate these x-rays by total external reflection into a collimated beam that can be directed to an EDS detector or to a WDS diffractor. By using such a collimator in WDS systems, the diffracting element can be located relatively far away from the sample, preferably outside the electron microscope, with as great as and generally significantly greater photon flux obtained than can be obtained with WDS systems in which the diffractor is mounted within the microscope. In addition, because the beam incident upon the diffracting element is collimated, the diffracting element can be flat rather than curved—as is typically required in prior WDS systems. This is a significant advantage, since a flat diffractor is more efficient at diffracting the entire beam than a curved diffractor. As a result, a WDS system using such collimating optics can be satisfactorily operated at much lower electron microscope beam currents than prior WDS systems.

A limitation of such conical mirror collimating optics is that, while the efficiency of reflection for low energy x-rays (100 eV to 1000 eV) is high, the efficiency of reflection of such conical mirror optics falls off significantly for x-rays at energies above about 1800 eV.

SUMMARY OF THE INVENTION

In accordance with the invention, a wavelength dispersive x-ray spectrometer incorporates an x-ray collimator having a grazing incidence mirror collimating optic and a polycapillary x-ray optic that are combined and mounted together at a position to collect a relatively large solid angle of x-rays emanating from a sample such as in an electron microscope. The grazing incidence mirror is formed as a tubular conical or quasi-conical mirror having a hollow bore with an inner mirror surface formed to intercept x-rays passing through the entrance aperture of the mirror and to reflect the x-rays at a grazing incidence angle into a substantially collimated beam that is parallel to the central axis of the mirror. The grazing incidence mirror is highly efficient at collecting and collimating x-rays having energies below about 1,000 eV. A polycapillary x-ray optic is mounted within the internal bore of the tubular x-ray mirror and is aligned with the central axis thereof. The polycapillary x-ray optic has an input end mounted adjacent to the entrance aperture of the tubular mirror. The input end of the polycapillary x-ray optic preferably is sized to receive x-rays emanating from the specimen that would otherwise not make a grazing incidence reflection from the internal wall of the tubular grazing incidence mirror; thus, there is substantially no loss of flux of x-rays collimated by the grazing incidence mirror as a result of the insertion of the polycapillary x-ray optic. The polycapillary x-ray optic receives x-rays at a smaller solid angle than the grazing incidence mirror, but captures diverging x-rays that would otherwise not be collimated by the mirror and directs such x-rays through the polycapillary optic to exit therefrom in a collimated central beam. In addition, the polycapillary x-ray optic is highly efficient at collecting and collimating x-rays in higher energy ranges, e.g., from 2,000 eV to 10,000 eV. Thus, the collimated x-ray beam exiting from the combined grazing incidence mirror and polycapillary optic efficiently collects x-rays over a very large energy range, from about 100 eV to 10,000 eV.

The combined grazing incidence mirror and polycapillary optic of the invention can be mounted with its entrance aperture near to the point of impact of the electron beam on the specimen in an electron microscope, while the diffracting element may be mounted well away from the collimator, preferably outside of the electron microscope and within its own housing. Within this housing, the diffracting element, detector or both may be mounted for rotational displacement to select the wavelengths that are to be detected by the detector. Because the beam directed by the x-ray collimator of the invention is substantially collimated, the diffracting element can be flat, allowing maximum collection of the x-ray beam and efficient direction of the wavelengths selected to the detector. A large area detector (e.g., a gas flow proportional counter) is preferably used to provide a signal indicative of the x-rays of the selected wavelength that are incident thereon.

Further objects, features and advantages of the invention will be apparent from the following detailed description when taken in conjunction with the accompanying drawings.

BRIEF DESCRIPTION OF THE DRAWINGS

In the drawings:

FIG. 3 is a cross-sectional view of a combined grazing incidence mirror optic and polycapillary x-ray optic in accordance with the invention.

FIG. 4 is an illustrative view of the combined optic of FIG. 3 illustrating the solid angle of x-rays captured by the entrance aperture of the grazing incidence mirror optic.

DETAILED DESCRIPTION OF THE INVENTION

Figure 1:
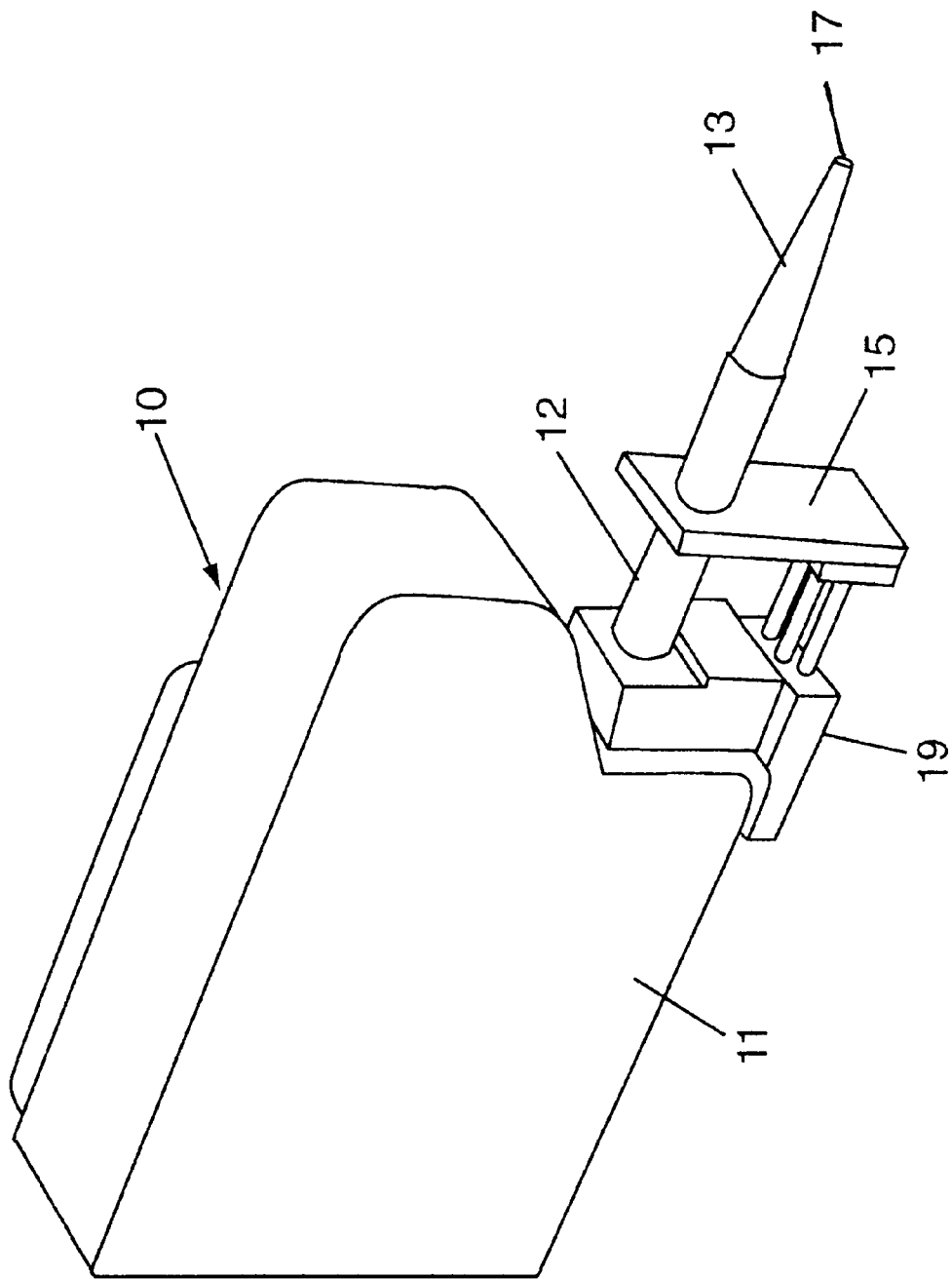
FIG. 1 is a perspective view of a wavelength dispersive spectrometer unit which may mounted on an electron microscope.

With reference to the drawings, a wavelength dispersive spectrometer unit in accordance with the invention is shown generally at 10 in FIG. 1 adapted for mounting on an electron microscope (not shown). The spectrometer unit 10 includes a housing 11 from which extends a tube 12 which terminates in an x-ray collimator optic 13. A mounting plate 15 is adapted to support the unit 10 on the wall of a microscope with the x-ray collimator 13 extending into the sample chamber so that the entrance aperture 17 of the collimator 13 can be positioned closely adjacent to a specimen within the microscope. The housing 11 is mounted on a sliding bearing 19 connected to the mounting plate 15 to allow the housing 11, and the tube 12 and collimator 13 connected thereto, to be advanced or retracted with respect to the mounting plate 15 to allow selected positioning of the entrance aperture 17 within the microscope sample chamber.

Figure 2:
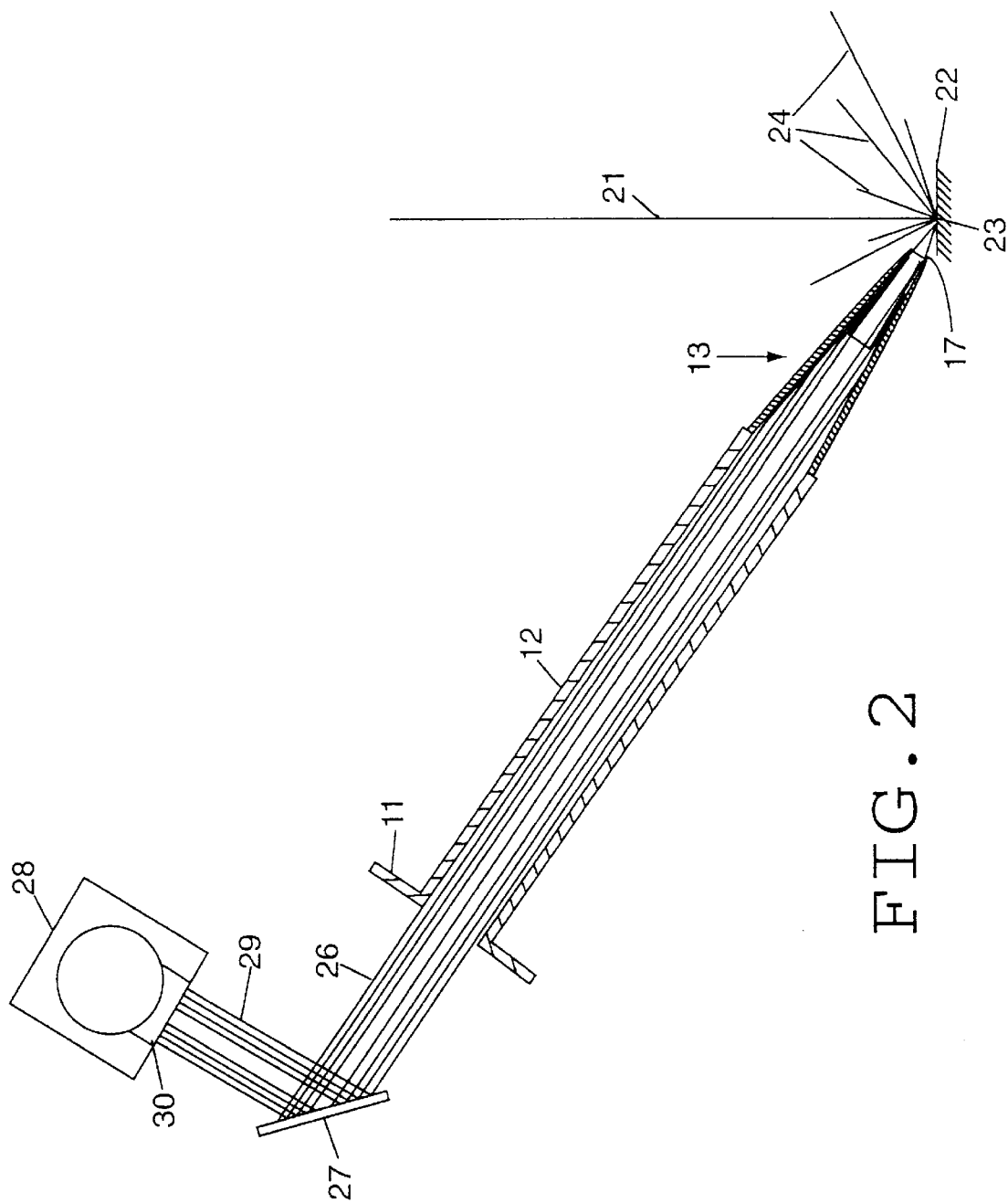
FIG. 2 is a schematic diagram illustrating the operation of the wavelength dispersive spectrometer of the invention utilized with an electron microscope.

The operation of the spectrometer 10 is illustrated with respect to the schematic view of FIG. 2, showing the positioning of the x-ray collimator 13 within an operating electron microscope. For purposes of illustration, the electron microscope provides a narrow beam 21 of electrons which impacts a specimen 22 within the sample chamber of the microscope at a position 23 on the specimen. As a result of the impact of the electron beam 21 with the specimen 22, x-rays 24 are emitted from the point of impact 23 on the specimen 22. The energies of the x-rays 24 emitted from the specimen 22 are indicative of the chemical constituents of the specimen 22 at the point of impact 23 of the electron beam 21. A portion of the x-rays 24 emitted from the specimen 22 pass through the entrance aperture 17 of the collimator 13 which, as discussed further below, collimates the x-rays 24 into a beam 26 which passes along the tube 12 into the housing 11 where the beam 26 is incident upon a diffracting element 27. The diffracting element 27 may be a natural crystal or a synthetic multilayer structure which defracts x-rays according to Braggs law. Because the beam 26 is substantially collimated, a flat surfaced crystal (or other multi-layer diffracting element) can be utilized. Exemplary diffracting elements 27 which may be employed include standard TAP, PET, LiF, CrSc and WSi diffracting elements, etc.

A detector 28 is positioned within the housing 11 to receive a beam of x-rays 29 which are diffracted by the diffracting element 27 at the proper angle to be incident upon the detecting face of the detector 28. The diffracting element 27 will deflect incoming x-rays in the beam 26 at differing angles as a function of the wavelength (or photon energy) of the x-rays. Thus, by changing the angle of the diffracting element 27 and/or the position of the detector 28, or both, the spectrometer can scan through the entire range of potential x-ray energies to determine the relative intensity of x-rays at each energy level to allow a spectrum to be generated from which information concerning the chemical constituents of the specimen 22 may be ascertained. The detector 28 is preferably a large area counter having a relatively large active detector surface area 30, e.g., a large area gas (e.g., Ar) flow proportional counter, for maximum sensitivity. Because the incoming beam 26 and the diffracted beam 29 are substantially collimated, a large area detector of this type may be utilized, contributing to the overall enhanced sensitivity of the spectrometer of the invention. Other detectors 28, such as a Xenen sealed counter, e.g., a Xenon sealed gas proportional counter of the ApeX spectrometer design, may also be employed.

The combined x-ray optic collimator 13 of the present invention is shown in cross-sectional detail in FIG. 3. The collimator 13 includes an outer grazing incidence x-ray mirror 32 having a hollow internal bore defined by a highly polished inner surface 33 and an exit aperture 34. The x-ray mirror 32 has a central axis 35 about which it is symmetric. The mirror 32 is preferably formed as described in U.S. Pat. No. 5,682,415 to David B. O'Hara, entitled Collimator For X-Ray Spectroscopy, which is incorporated herein by reference. An exemplary commercially available x-ray mirror 32, which may be employed to form a combined x-ray collimator in accordance with the present invention, is the low energy grazing incidence cone available from Parallax Research, Inc. of Tallahassee, Fla. The grazing incidence x-ray mirror 32 receives x-rays from the spot 23 at which the electron beam 21 impacts upon the specimen, preferably located along the central axis 35 of the mirror 32, and collimates such x-rays by a grazing incidence total external reflection at the mirror surface 33 for those x-rays emanating from the target spot 23 that pass through the entrance aperture 17 and are intercepted by the mirror surface 33. A mounting ring 37 is attached to the grazing incidence x-ray mirror 32, with the mounting ring 37 being attached to the end of the tube 12 by screws 39 and 40. The screws 39 and 40 provide a spring tensioned adjustable mounting for the mounting ring 37 to the end of the tube 12, allowing the orientation of the central axis 35 of the mirror 32 to be adjusted.

The x-ray collimator 13 also includes a polycapillary x-ray optic 42, mounted within the bore of the grazing incidence x-ray mirror 32. (For example, the polycapillary x-ray optic may be nested into the largest parabolic cone of the Parallax L-line optic design (three nested cones). The large cone is utilized for increasing the capture angle for 90 to 300 eV x-rays, thus compensating for the poorer efficiency of the polycapillary optic over this range. Multiple grazing incidence cones may be nested with a single polycapillary optic to cover a broad energy range.) The polycapillary x-ray optic 42 may be supported in the grazing incidence x-ray mirror by a polycapillary support tube 44. The support tube 44 is attached at its back end to a precision support mount 45 which is attached to the end of the tube 12. The polycapillary x-ray optic 42 preferably consists of an array of hollow polycapillaries with thousands of individual channels having inside diameters typically in the range of 8 to 50 $\mu$m. X-rays entering the input end 46 of the polycapillary x-ray optic 42 that pass into the open ends of the capillaries experience multiple total external reflections from the smooth inner walls of the capillary channels. The polycapillary x-ray optic is preferably formed to collimate the x-rays striking the input end 46 to provide a collimated output beam which is substantially parallel to the central axis 35 of the outer grazing incidence mirror 32. Such polycapillary x-ray optics are available commercially from X-Ray Optical Systems, Inc., 90 Fuller Road, Albany, N.Y. 12205. The principles behind such optics are described in, e.g., J.P. Kirkland, et al. "Wavelength Dispersive X-Ray Fluorescence Detector," Rev. Sci. Instrum. Vol. 66, No. 2, Feb., 1995, pp. 1410–1412, incorporated herein by reference.

The x-rays emanating from the target spot 23 that are incident upon the polycapillary optic 42 are collimated into a central portion 47 of the x-ray beam 26, whereas the x-rays from the target spot 23 which pass into the entrance aperture 17 and are not intercepted by the input end face 46 of the polycapillary optic 42 are reflected off of the internal mirror surface 33 of the grazing incidence mirror 32 and are thereby collimated into a concentric outer beam portion 48 of the output beam 26. By adjusting the screws 39 and/or 40 to adjust the alignment of the grazing incidence mirror 32, the collimated outer beam portion 48 can be made fully concentric and coaxial with the inner collimated beam portion 47.

Proper co-alignment of the grazing incidence mirror 32 and polycapillary x-ray optic 42 is important. Problems with co-alignment of the two optics 32 and 42 may contribute to reduced resolution of light elements. Therefore, a co-alignment mechanism which allows for co-alignment of the grazing incidence mirror 32 and the polycapillary x-ray optic 42 in both the focal distance and the concentricity along the optical axis is preferably employed. As described previously, such an alignment mechanism can be achieved by mounting the outer grazing incidence optic 32 such that its position can be adjusted relative to a fixed central polycapillary optic 42. Alternatively, co-alignment may be achieved by fixing the position of the outer grazing incidence optic 32, and adjusting the position of the central polycapillary optic 42. Any method or mechanism known to those skilled in the art may be used to provide co-alignment of the grazing incidence optic 32 and polycapillary optic 42, by allowing adjustment of the nested optics 32 and 42 relative to each other.

FIG. 4 illustrates the solid angle of the rays emanating from the target spot 23 that pass into the entrance aperture 17. By proper selection of the size of the input end face 46 of the polycapillary optic 42, the cone of x-rays emanating from the target spot 23 that just passes by the edge of the (preferably circular) input end face 46 of the polycapillary optic 42 will be intercepted by the mirror surface 33, at a position near the exit aperture 34, and will be reflected therefrom in a direction substantially parallel to the central axis 35 of the grazing incidence mirror 32. The cone of x-rays emanating from the target spot 23 that just reaches the mirror surface 33 inside the entrance aperture 17 will be reflected from the mirror surface in a direction substantially parallel to the central axis 35 and will just pass by the polycapillary optic 42 and its support tube 44, as illustrated by the beam line labeled 50 in FIG. 4. It is thus seen that there is substantially no loss of the x-ray flux reflected from the conical grazing incidence mirror 32 as a result of the interposition of the polycapillary tube optic 42, since any x-rays emanating from the target spot 23 that are incident upon the input end face 46 of the polycapillary optic 42 would not have been intercepted by the mirror surface 33 of the grazing incidence mirror 32, and thus would not have been reflected to reach the detector 28 (except for those x-rays which were very close to the central axis 35 and thus would have reached the diffracting element without undergoing reflection).

Figure 5:
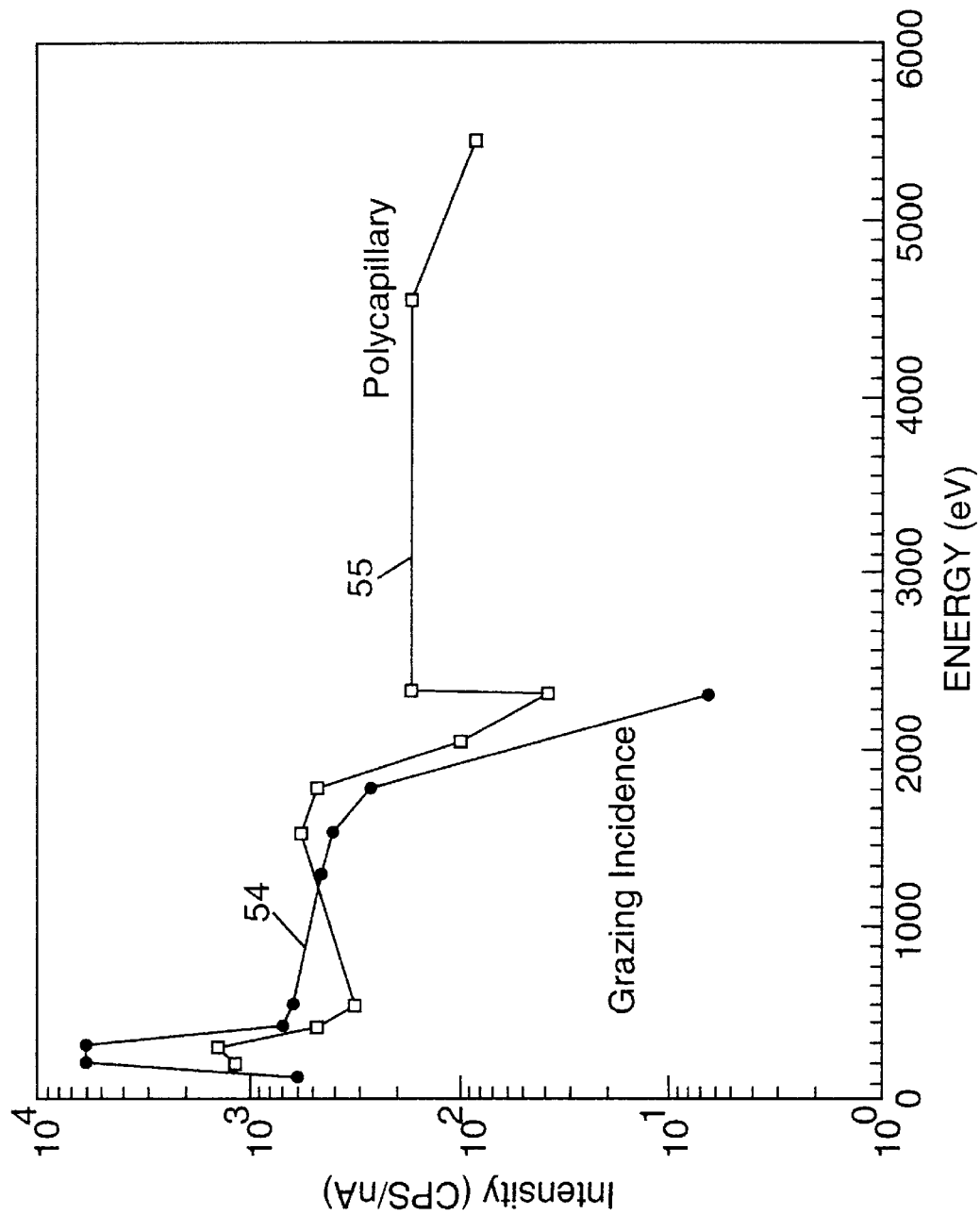
FIG. 5 is a diagram plotting the intensity of x-rays captured and collimated by the grazing incidence mirror optic and the polycapillary x-ray optic as a function of x-ray photon energy.

FIG. 5 is a graph illustrating the improved performance available from the combination grazing incidence mirror and polycapillary optic collimator 13 of the invention. A plot of x-ray intensity as a function of the energy of the x-rays passed through the grazing incidence mirror 32 is shown by the graph labeled 54, and a plot of intensity of x-rays passed through the polycapillary optic 42 as a function of x-ray energy is shown by the graph labeled 55. As illustrated, the grazing incidence mirror 32 provides a significantly greater intensity of x-rays at lower energies, particularly in the 100 eV to 500 eV range, than the polycapillary x-ray optic, whereas the polycapillary optic provides significantly higher intensity for higher energy x-rays, particularly x-rays with energies greater than 2,000 eV. As a consequence, the combined x-ray collimator 13 of the present invention provides excellent beam collection efficiency over a very broad range of x-ray energies, essentially from 100 eV to 10,000 eV. In addition, as noted above, the polycapillary optic 42 captures and collimates lower energy x-rays that would not have been reflected and collimated by the grazing incidence mirror 32 alone, thereby further enhancing the lower energy (e.g., below about 2,000 eV) performance of the spectrometer.

The performance of a wavelength dispersive spectrometer employing a combined grazing incidence mirror optic and polycapillary x-ray optic in accordance with the present invention is illustrated by the exemplary experimental WDS spectra presented in FIGS. 6–10. The WDS spectra presented in FIGS. 6–10 were obtained using a MAXray WDS parallel beam spectrometer (available from Noran Instruments, Inc. of Middleton, Wis.) mounted on a JEOL 840 scanning electron microscope. (Of course, it should be understood that a combined grazing incidence mirror optic and polycapillary x-ray optic in accordance with the present invention may also be employed in combination with other x-ray spectrometers and microscopes.)

Figure 6:
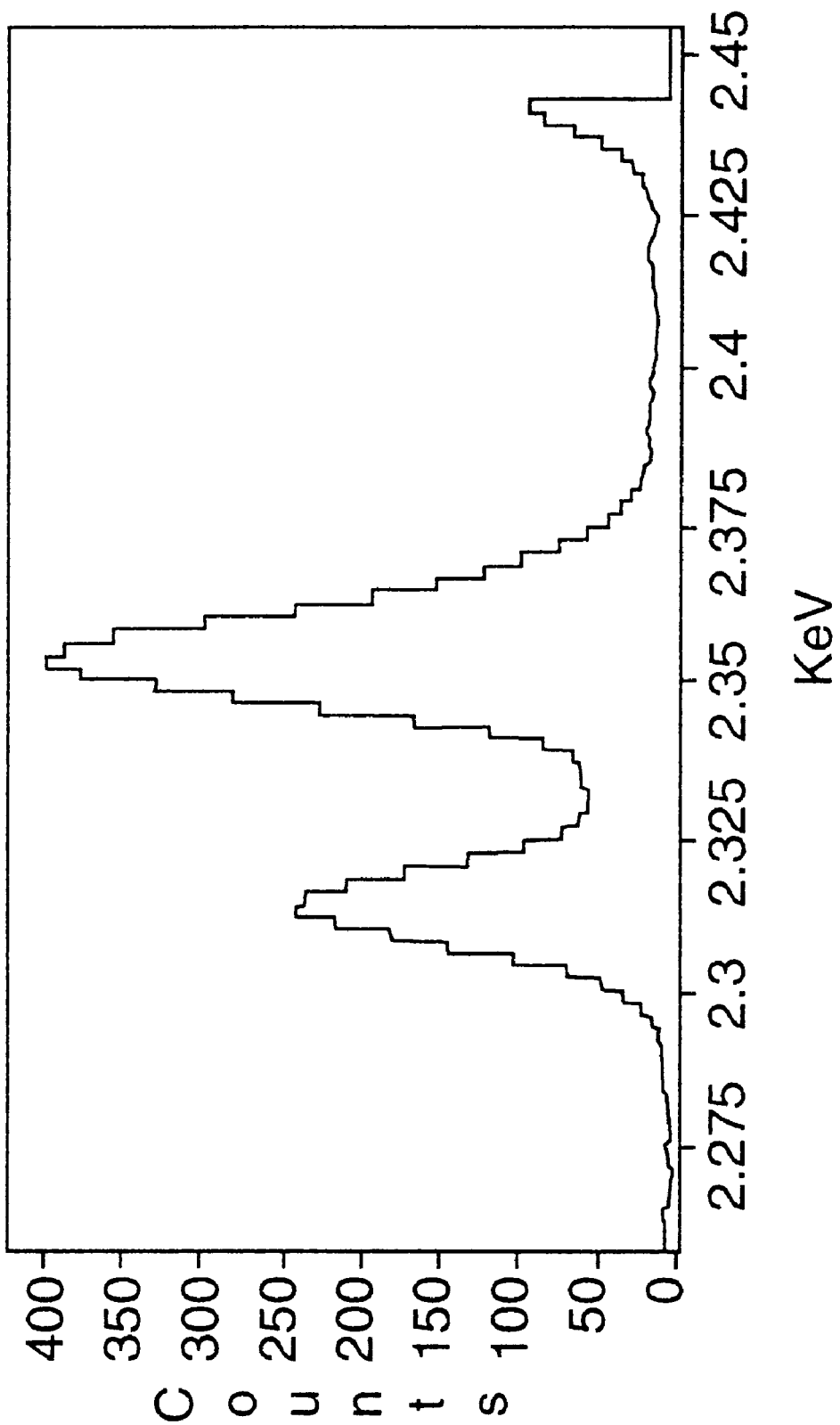
FIG. 6 is a WDS spectrum obtained from a specimen of Pb and S using a combined grazing incidence mirror optic and polycapillary x-ray optic in accordance with the present invention.

A combined grazing incidence mirror optic and polycapillary x-ray optic in accordance with the present invention extends the range of WDS spectrometers well beyond the limits imposed by grazing incidence x-ray optics alone. For example, FIG. 6 is a WDS spectrum obtained from a specimen of Pb and S using a PET defractor at 20 kV and 10.1 nA and a WDS spectrometer employing a combined grazing incidence mirror optic and polycapillary x-ray optic in accordance with the present invention. No comparable spectrum exists for a WDS spectrometer employing a grazing incidence x-ray optic alone, as the energy of the x-rays from this specimen is well beyond the range of such conventional grazing incidence x-ray optics.

Figure 7:
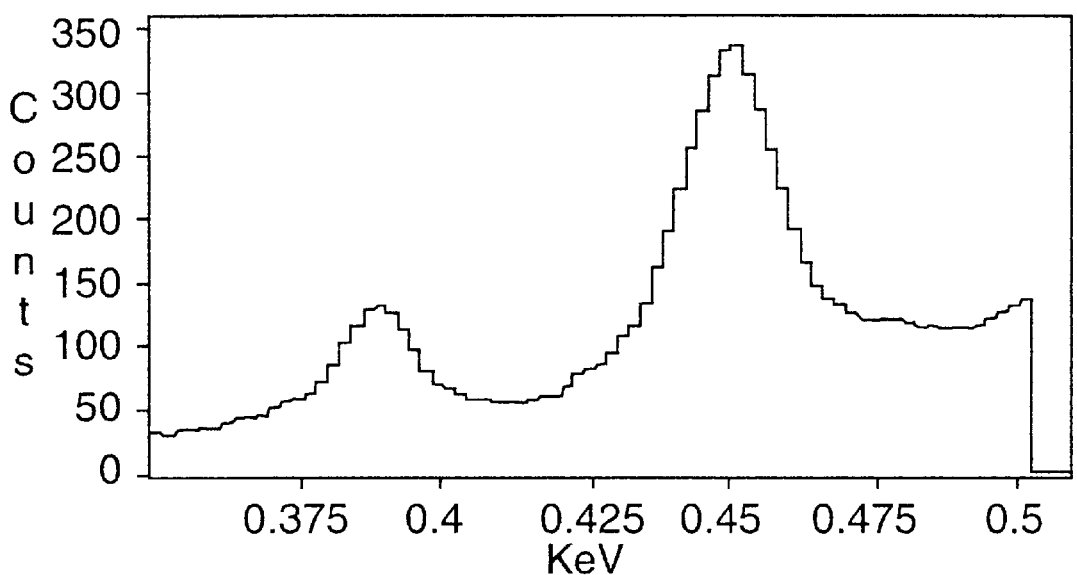
FIG. 7 is a WDS spectrum obtained from a Ti pure element specimen using a grazing incidence mirror optic.
Figure 8:
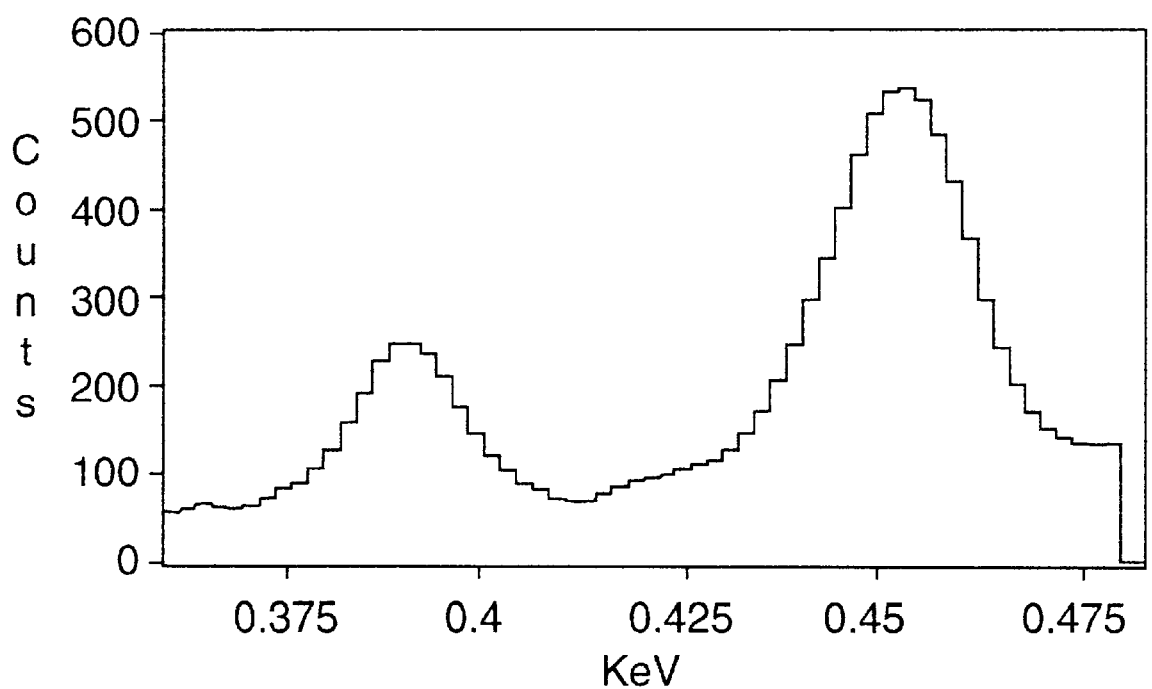
FIG. 8 is a WDS spectrum obtained from a Ti pure element specimen using a combined grazing incidence mirror optic and polycapillary x-ray optic in accordance with the present invention.

A polycapillary x-ray optic combined with a grazing incidence mirror in accordance with the present invention forms a novel hybrid optic which is capable of extending the range of conventional grazing incidence x-ray optics while maintaining low energy sensitivity. For example, FIGS. 7 and 8 show the WDS spectra obtained from a Ti pure element standard specimen using an OSMIC NiC/Ti multilayer defractor. The spectrum in FIG. 7 was obtained using a conventional grazing incidence x-ray optic. The spectrum in FIG. 8 was obtained using a combined grazing incidence mirror optic and polycapillary x-ray optic in accordance with the present invention. The spectrum obtained by the combined optic shows better intensity by a factor of approximately 1.7. Thus, there was no reduction of intensity using the combined optic at this relatively low energy range.

Figure 9:
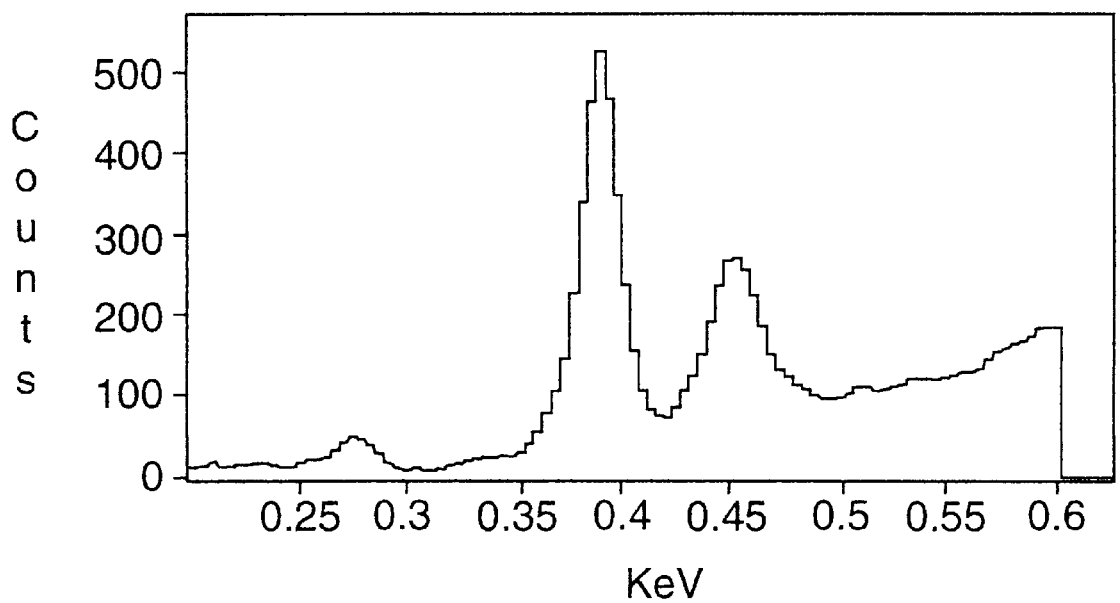
FIG. 9 is a WDS spectrum obtained from a TiN thin film specimen using a grazing incidence mirror optic.
Figure 10:
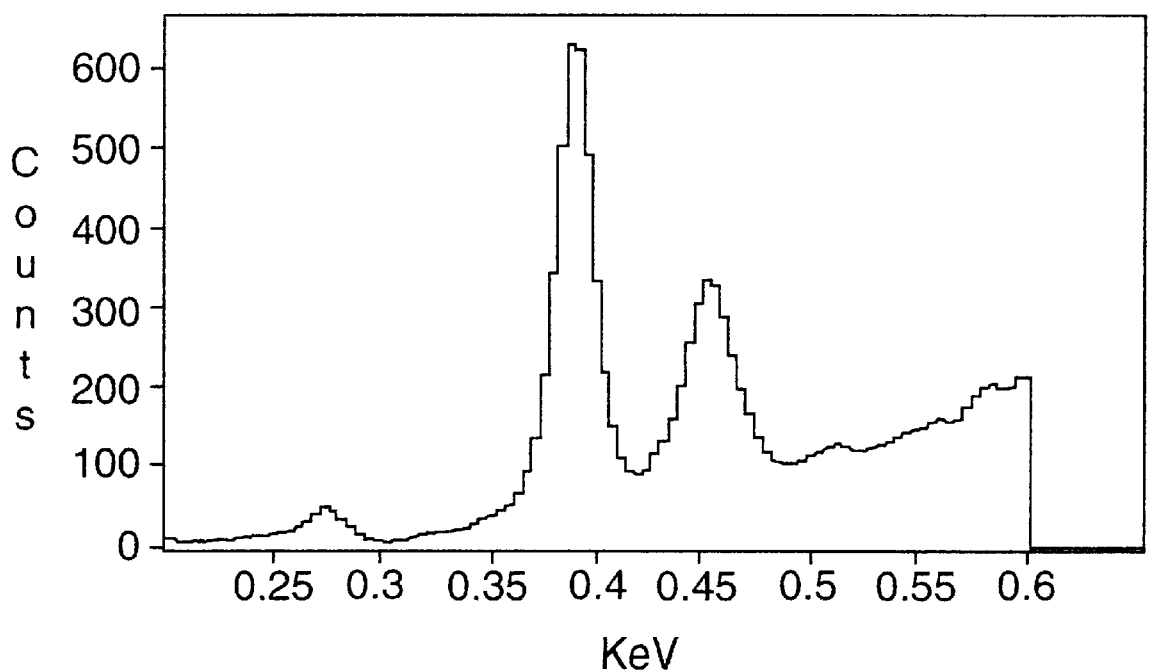
FIG. 10 is a WDS spectrum obtained from a TiN thin film specimen using a combined grazing incidence mirror optic and polycapillary x-ray optic in accordance with the present invention.

Similarly, FIGS. 9 and 10 show WDS spectra obtained from a TiN thin film specimen using the OSMIC NiC/Ti multilayer defractor. The WDS spectrum of FIG. 9 was obtained using a grazing incidence mirror optic. The WDS spectrum of FIG. 10 was obtained using a combined grazing incidence mirror optic and polycapillary x-ray optic in accordance with the present invention. Once again, the combined optic shows improved intensities, in this case by a factor of 1.2. Note that there are not any spectral artifacts attributable to use of the combined optic.

It should be understood that the present invention is not limited to the particular exemplary embodiments and applications illustrated and described herein, but embraces all such modified forms thereof as come within the scope of the following claims. In particular, it should be noted that an x-ray collimator in accordance with the present invention may be employed in applications other than WDS, such EDS.

What is claimed is:

1. An x-ray collimator, comprising:
    (a) a grazing incidence mirror collimating optic having an entrance aperture, an exit aperture, and a hollow bore with an inner mirror surface formed to intercept x-rays passing through the entrance aperture and to reflect the x-rays at a grazing incidence angle into a substantially collimated beam that is projected out of the exit aperture parallel to an axis of the hollow bore; and
    (b) a polycapillary x-ray optic having an input end and an output end mounted within the hollow bore of the grazing incidence mirror collimating optic and aligned parallel with the axis of the hollow bore to collimate x-rays received at the input end into a collimated beam projected out of the output end parallel to the axis of the hollow bore.

2. The x-ray collimator of claim 1 wherein the grazing incidence mirror collimating optic has a tubular conical inner mirror surface.

3. The x-ray collimator of claim 1 wherein an axis of the polycapillary x-ray optic is aligned with the axis of the hollow bore.

4. The x-ray collimator of claim 1 wherein the input end of the polycapillary x-ray optic is aligned with the entrance aperture of the grazing incidence mirror collimating optic.

5. The x-ray collimator of claim 1 wherein the polycapillary x-ray optic is sized and positioned within the hollow bore of the grazing incidence mirror collimating optic to receive only x-rays passing through the entrance aperture of the grazing incidence mirror collimating optic at angles such that the x-rays would not make a grazing incidence reflection from the inner mirror surface of the grazing incidence mirror collimating optic.

6. The x-ray collimator of claim 1 wherein the polycapillary x-ray optic includes an array of hollow polycapillaries having inside diameters in the range of approximately 8 to 50 micrometers.

7. The x-ray collimator of claim 1 comprising additionally a co-alignment mechanism for co-aligning the grazing incidence mirror collimating optic and the polycapillary x-ray optic.

8. A wavelength dispersive x-ray spectrometer, comprising:
    (a) an x-ray collimator including a grazing incidence mirror collimating optic having an entrance aperture, an exit aperture, and a hollow bore with an inner mirror surface formed to intercept x-rays passing through the entrance aperture and to reflect the x-rays at a grazing incidence angle into a substantially collimated beam that is projected out of the exit aperture parallel to an axis of the hollow bore, and a polycapillary x-ray optic having an input end and an output end mounted within the hollow bore of the grazing incidence mirror collimating optic and aligned parallel with the axis of the hollow bore to collimate x-rays received at the input end into a collimated beam projected out of the output end parallel to the axis of the hollow bore;
    (b) a diffracting element positioned to diffract the collimated x-ray beams projected out of the exit aperture of the grazing incidence mirror collimating optic and the output end of the polycapillary x-ray optic; and
    (c) an x-ray detector positioned to receive the x-ray beams diffracted by the diffracting element.

9. The wavelength dispersive x-ray spectrometer of claim 8 wherein the grazing incidence mirror collimating optic has a tubular conical inner mirror surface.

10. The wavelength dispersive x-ray spectrometer of claim 8 wherein an axis of the polycapillary x-ray optic is aligned with the axis of the hollow bore.

11. The wavelength dispersive x-ray spectrometer of claim 8 wherein the input end of the polycapillary x-ray optic is aligned with the entrance aperture of the grazing incidence mirror collimating optic.

12. The wavelength dispersive x-ray spectrometer of claim 8 wherein the polycapillary x-ray optic is sized and positioned within the hollow bore of the grazing incidence mirror collimating optic to receive only x-rays passing through the entrance aperture of the grazing incidence mirror collimating optic at angles such that the x-rays would not make a grazing incidence reflection from the inner mirror surface of the grazing incidence mirror collimating optic.

13. The wavelength dispersive x-ray spectrometer of claim 8 wherein the polycapillary x-ray optic includes an array of hollow polycapillaries having inside diameters in the range of approximately 8 to 50 micrometers.

14. The wavelength dispersive x-ray spectrometer of claim 8 comprising additionally a co-alignment mechanism for co-aligning the grazing incidence mirror collimating optic and the polycapillary x-ray optic.

15. The wavelength dispersive x-ray spectrometer of claim 8 wherein the diffracting element is mounted in a diffracting element housing separated from the x-ray collimator.

16. The wavelength dispersive x-ray spectrometer of claim 15 wherein the x-ray collimator is mounted on a distal end of a collimator support tube extending from the diffracting element housing.

17. The wavelength dispersive x-ray spectrometer of claim 16 comprising additionally means for mounting the x-ray collimator to the distal end of the collimator support tube such that an orientation of the axis of the hollow bore of the grazing incidence mirror collimating optic is adjustable.

18. The wavelength dispersive x-ray spectrometer of claim 16 comprising additionally a polycapillary support tube attached to the collimator support tube and the polycapillary x-ray optic to support the polycapillary x-ray optic within the hollow bore of the grazing incidence mirror collimating optic.

19. The wavelength dispersive x-ray spectrometer of claim 15 wherein the x-ray detector is mounted in the diffracting element housing along with the diffracting element.

20. The wavelength dispersive x-ray spectrometer of claim 8 wherein the diffracting element is flat surfaced.

21. The wavelength dispersive x-ray spectrometer of claim 8 wherein the diffracting element is selected from the group of diffracting elements consisting of natural crystal and synthetic multi-layer diffracting elements.

22. The wavelength dispersive x-ray spectrometer of claim 8 wherein the x-ray detector is a gas flow proportional counter.

23. A method for directing x-rays emitted from a sample specimen, comprising the steps of:
   (a) directing an energy beam at the sample to cause x-rays to be emitted from the sample; and
   (b) positioning an x-ray collimator to receive and direct the x-rays emitted from the sample, wherein the x-ray collimator includes a grazing incidence mirror optic having an entrance aperture, an exit aperture, and a hollow bore with an inner mirror surface formed to intercept x-rays passing through the entrance aperture and to direct the x-rays into a beam that is projected out of the exit aperture, and a polycapillary x-ray optic having an input end and an output end mounted within the hollow bore of the grazing incidence mirror optic to direct x-rays received at the input end into a beam projected out of the output end.

24. The method of claim 23 wherein the grazing incidence mirror optic reflects the x-rays at a grazing incidence angle into a substantially collimated beam that is projected out of the exit aperture parallel to an axis of the hollow bore, wherein the polycapillary x-ray optic is aligned parallel with the axis of the hollow bore to collimate x-rays received at the input end into a collimated beam projected out of the output end parallel to the axis of the hollow bore, and comprising the additional steps of:
   (a) diffracting the collimated x-ray beams projected out of the exit aperture of the grazing incidence mirror optic and the output end of the polycapillary x-ray optic; and
   (b) detecting the diffracted x-ray beams.

25. The method of claim 23 comprising the additional step of co-aligning the grazing incidence mirror optic and the polycapillary x-ray optic.

26. The method of claim 23 wherein the step of directing an energy beam at the sample includes the step of directing an electron beam at the sample.

27. An x-ray collimator, comprising:
   (a) a grazing incidence mirror optic having an entrance aperture, an exit aperture, and a hollow bore with an inner mirror surface formed to intercept x-rays passing through the entrance aperture and to direct the x-rays into a beam that is projected out of the exit aperture; and
   (b) a polycapillary x-ray optic having an input end and an output end mounted within the hollow bore of the grazing incidence mirror optic to direct x-rays received at the input end into a beam projected out of the output end.

* * * * *